(12) United States Patent
Liu et al.

(10) Patent No.: US 12,300,572 B2
(45) Date of Patent: May 13, 2025

(54) ERROR-UNLOCKING PROTECTION STRUCTURE FOR HEAT DISSIPATION BASE SEAT

(71) Applicant: ASIA VITAL COMPONENTS (CHINA) CO., LTD., Shenzhen (CN)

(72) Inventors: Xue-Hui Liu, Shenzhen (CN); Lei Li, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 245 days.

(21) Appl. No.: 18/133,503

(22) Filed: Apr. 11, 2023

(65) Prior Publication Data
US 2023/0389234 A1    Nov. 30, 2023

(30) Foreign Application Priority Data
May 31, 2022 (TW) .................................. 111120245

(51) Int. Cl.
| | |
|---|---|
| *H05K 7/20* | (2006.01) |
| *H01L 23/40* | (2006.01) |
| *H05K 1/02* | (2006.01) |

(52) U.S. Cl.
CPC ....... *H01L 23/4006* (2013.01); *H05K 7/2049* (2013.01); *H01L 2023/405* (2013.01);
(Continued)

(58) Field of Classification Search
CPC ............. H05K 7/2039; H05K 7/20409; H05K 7/20418; H05K 7/20436; H05K 7/2049;
(Continued)

(56) References Cited

U.S. PATENT DOCUMENTS

| | | | |
|---|---|---|---|
| 6,724,629 B1 * | 4/2004 | Augustin ............ | H01L 23/4093 174/16.3 |
| 2005/0126753 A1 | 6/2005 | Lee et al. | |

(Continued)

FOREIGN PATENT DOCUMENTS

| | | |
|---|---|---|
| CN | 101861081 A | 10/2010 |
| CN | 104936414 A | 9/2015 |

(Continued)

OTHER PUBLICATIONS

Search Report dated Jun. 18, 2024 issued by China National Intellectual Property Administration for counterpart application No. 2022106116275.

(Continued)

*Primary Examiner* — Jayprakash N Gandhi
*Assistant Examiner* — Steven Ngo
(74) *Attorney, Agent, or Firm* — Demian K. Jackson; Jackson IPG PLLC

(57) ABSTRACT

An error-unlocking protection structure for heat dissipation base seat includes a heat dissipation base seat, an operation member and a cover body. The operation member has a cam section pivotally connected with the connection section disposed on the heat dissipation base seat. A linking member is disposed between the cover body and the operation member and respectively connected with the cover body and the cam section. When operating the operation member, the cam section is forced to press the heat dissipation base seat and make the heat dissipation base seat tightly attached to the heat generation component and located thereon. At the same time, the linking member is driven to horizontally move the cover body relative to the heat dissipation base seat, whereby the cover body shields locking members to prevent the heat dissipation base seat from being uninstalled from the heat generation component by error.

9 Claims, 7 Drawing Sheets

(52) U.S. Cl.
CPC .............. *H01L 2023/4075* (2013.01); *H01L 2023/4081* (2013.01); *H01L 2023/4087* (2013.01); *H05K 1/0203* (2013.01)

(58) Field of Classification Search
CPC .... H05K 1/0201; H05K 1/0203; H01L 23/40; H01L 23/4006; H01L 23/4018; H01L 23/4075; H01L 23/4093; H01L 2023/405; H01L 2023/4075; H01L 2023/4081; H01L 2023/4087; G06F 1/20
See application file for complete search history.

(56) References Cited

U.S. PATENT DOCUMENTS

| | | | | |
|---|---|---|---|---|
| 2017/0110841 | A1* | 4/2017 | Hachuda | H01R 13/62922 |
| 2018/0350717 | A1* | 12/2018 | Jheng | F16M 13/02 |
| 2023/0247794 | A1* | 8/2023 | Tseng | H01L 23/4006 |
| | | | | 165/104.19 |

FOREIGN PATENT DOCUMENTS

| | | |
|---|---|---|
| TW | M482254 U | 7/2014 |
| TW | 201712292 A | 4/2017 |
| TW | M577637 U | 5/2019 |
| WO | 2020214493 A1 | 10/2020 |

OTHER PUBLICATIONS

Search Report dated Oct. 26, 2022 issued by Taiwan Intellectual Property Office for counterpart application No. 111120245.

\* cited by examiner

ERROR-UNLOCKING PROTECTION STRUCTURE FOR HEAT DISSIPATION BASE SEAT

This application claims the priority benefit of Taiwan patent application number 111120245 filed on May 31, 2022.

BACKGROUND OF THE INVENTION

1. Field of the Invention

The present invention relates generally to a heat dissipation base seat, and more particularly to an error-unlocking protection structure for heat dissipation base seat.

2. Description of the Related Art

Along with the rapid development of electronic industries, the operation speed of electronic components is continuously increased. In operation, the electronic components generate a great amount of heat to raise the temperature of the electronic components themselves and the temperature of the system. The high temperature will affect the stability of the system. In order to ensure that the electronic components normally operate, in general, a heat sink is installed on the electronic components to exhaust the heat generated by the electronic components. Currently, in general, the solution to heat dissipation problem of the electronic components is to selectively install a heat sink or a heat conduction member on each heat generation electronic component (such as a central processing unit or a graphics processing unit). The heat conduction member is generally selectively a heat pipe or a vapor chamber for uniformly conducting out the heat generated by the heat generation electronic component or transfer the heat generated by the heat generation electronic component to a remote end for dissipating the heat. Both the heat pipe and the vapor chamber need to be secured onto the heat source through a base seat or through the base seat and a securing seat disposed around the heat source.

Please refer to FIGS. 4A and 4B. At least one heat generation electronic component 7 (such as a central processing unit or a graphics processing unit) is disposed on the motherboard 4 of a conventional electronic device (such as a computer, a server or a notebook). The bottom side of a heat sink 6 is attached to and in contact with the heat generation electronic component 7 to dissipate the heat generated by the heat generation electronic component 7. In order to securely assemble the heat sink 6 with the heat generation electronic component 7, the manufacturer generally arranges a securing seat 41 around the heat generation electronic component 7 on the motherboard 4. The heat sink 6 is secured onto the securing seat 41 by means of a latch device 5. The latch device 5 has a down-pressing section 51, a first latch section 52, a second latch section 53 and an operation member 54. The operation member 54 has a cam section 541 disposed on an upper side of one end of the down-pressing section 51. One end of the first latch section 52 passes through one end of the down-pressing section 51 to pivotally connected with the cam section 541 of the operation member 54. The other end of the down-pressing section 51 is connected with one end of the second latch section 53. Each of the other ends of the first and second latch sections 52, 53 is formed with a latch hole 521, 531. The securing seat 41 has two protrusion sections 411 respectively latched in the corresponding latch holes 521, 531. When assembling and locking the latch device 5, the protrusion sections 411 of the securing seat 41 are first engaged in the latch holes 521, 531 of the first and second latch sections 52, 53. Then the operation member 54 is rotated to make the cam section 541 slide along the other end of the down-pressing section 51 to a locking position. At this time, the second latch section 53 is lifted and the down-pressing section 51 is pressed against the heat sink 6 to apply a pressing force to the heat sink 6. Accordingly, the heat sink 6 is tightly attached to the heat generation electronic component 7 to conduct and dissipate the heat generated by the heat generation electronic component 7.

However, the operation member 54 of the above latch device 5 is exposed to outer side of the heat sink 6. Therefore, in operation, it often takes place that after the operation member 54 is shifted within a limited space to the locking position or after the other peripheral members are completely assembled, when an operator's hand is withdrawn from the limited space, the operator's hand touches or shifts the operation member 54 to an unlocking position by error. In this case, the down-pressing section 51 is released by error and fails to press the heat sink 6. As a result, the heat sink 6 cannot tightly attach to the heat generation electronic component 7.

It is therefore tried by the applicant to provide an error-unlocking protection structure for heat dissipation base seat to solve the above problem existing in the prior art.

SUMMARY OF THE INVENTION

It is therefore a primary object of the present invention to provide an error-unlocking protection structure for heat dissipation base seat, which can prevent the operation member from being touched and shifted by error to uninstall the heat dissipation base seat.

To achieve the above and other objects, the error-unlocking protection structure for heat dissipation base seat of the present invention includes a heat dissipation base seat, an operation member and a cover body. The heat dissipation base seat has a top side, a bottom side and multiple perforations formed through four corners of the heat dissipation base seat. A locking member is passed through each perforation to secure the heat dissipation base seat on an upper side of a heat generation component and make the bottom side of the heat dissipation base seat in contact with the heat generation component. A connection section is disposed on the top side of the heat dissipation base seat to protrude therefrom. The connection section has a protruding end. The operation member has a cam section pivotally connected with the protruding end of the connection section. The cover body is disposed on the heat dissipation base seat and has multiple perforations respectively corresponding to the perforations of the heat dissipation base seat. A linking member is disposed between the cover body and the operation member and respectively connected with the cover body and the cam section of the operation member. When operating the operation member, the cam section is forced to press the top side of the heat dissipation base seat and make the heat dissipation base seat vertically tightly attached to the heat generation component and located thereon. At the same time, the linking member is driven to drive the cover body to horizontally move relative to the heat dissipation base seat, whereby the cover body shields the locking members to prevent the heat dissipation base seat from being uninstalled from the heat generation component by error.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
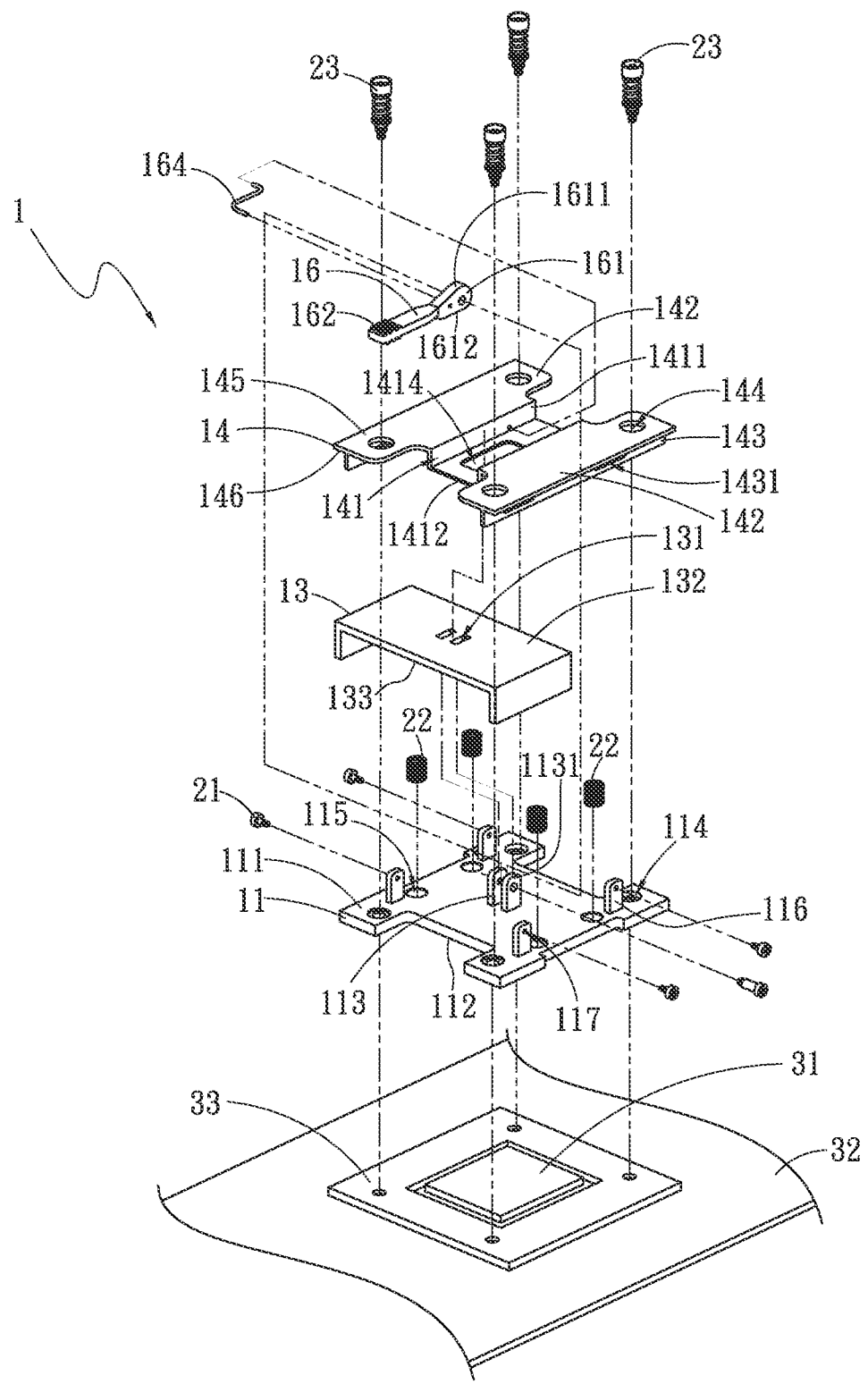
FIG. 1 is a perspective exploded view of the present invention.
Figure 2A:
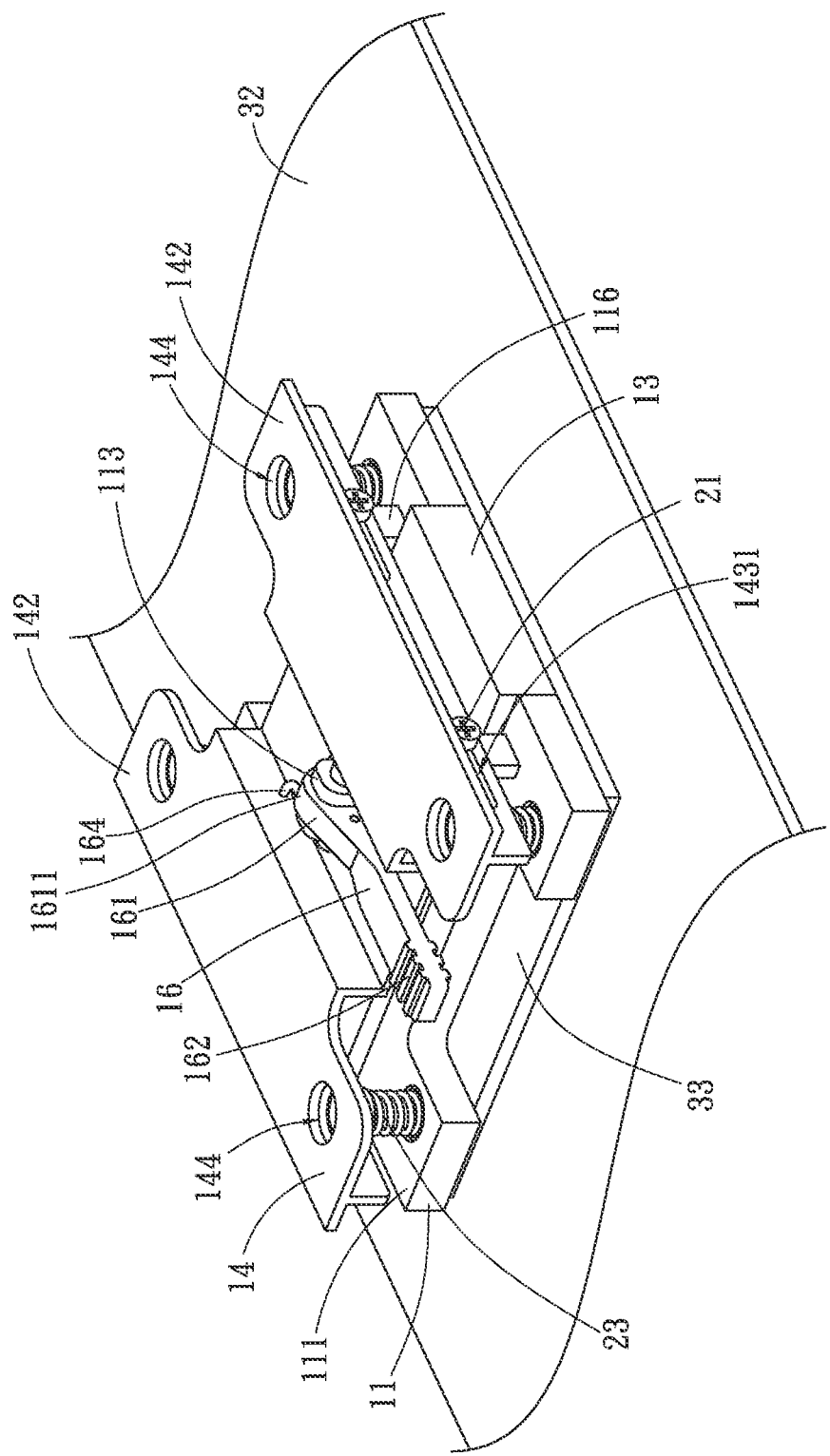
FIG. 2A is a perspective assembled view of the present invention.
Figure 2B:
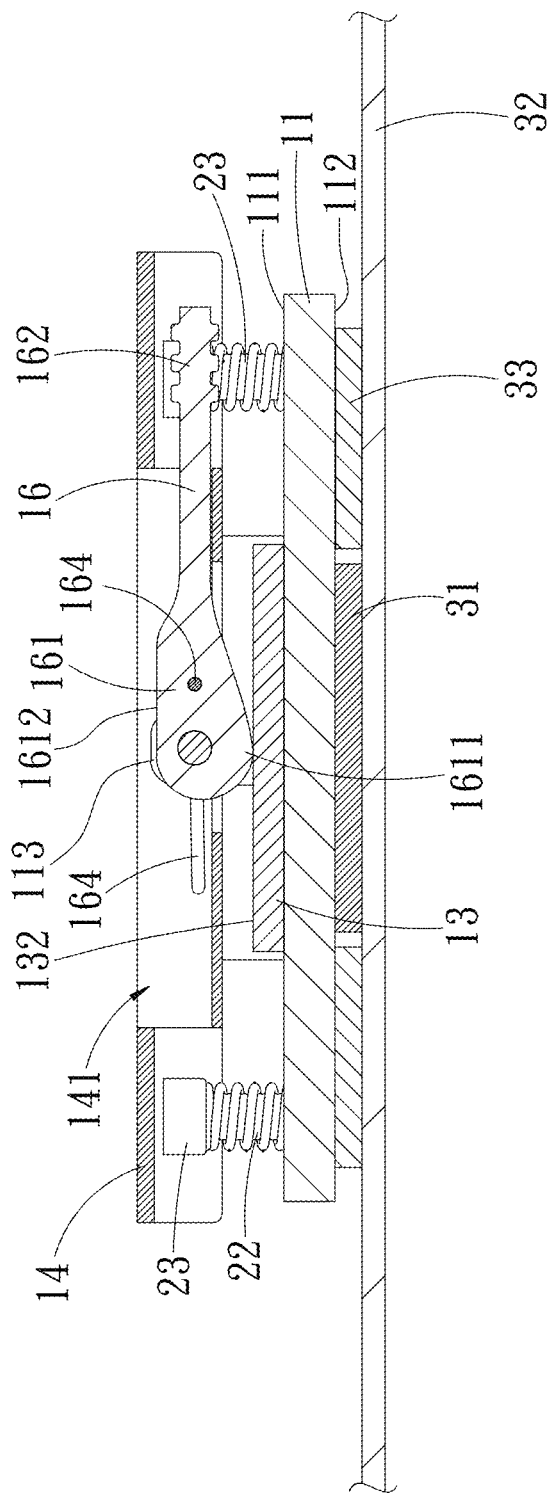
FIG. 2B is a sectional assembled view of the present invention according to FIG. 2A.

Please refer to FIGS. 1, 2A and 2B. The error-unlocking protection structure 1 for heat dissipation base seat of the present invention includes a heat dissipation base seat 11, a press member 13, a cover body 14 and an operation member 16. The press member 13 is positioned on the heat dissipation base seat 11. The cover body 14 is positioned on the press member 13.

The heat dissipation base seat 11 has a top side 111, a bottom side 112 and a connection section 113 disposed on the top side 111 and protruding therefrom. In this embodiment, the connection section 113 is two upright columns side by side disposed at a center of the top side 111 at an interval. Each column has a protruding end 131 outward protruding from the top side 111 in a direction away from the heat dissipation base seat 11. In addition, each of four corners of the heat dissipation base seat 11 is formed with a perforation 114. Multiple depressions 115 and multiple protruding columns 116 are disposed on the top side 111 in adjacency to the perforations 114. Each protruding column 116 is positioned between each depression 115 and each perforation 114 to outward vertically protrude from the top side 111.

The perforation 114 passes through the heat dissipation base seat 11 from the top side 111 to the bottom side 112. Multiple locking members 23 (such as screws) are passed through the perforations 114 of the heat dissipation base seat 11 to secure the heat dissipation base seat 11 on an upper side of a heat generation component 31. In this embodiment, the heat dissipation base seat 11 is, but not limited to, locked and secured on a circuit board securing base seat 33 around the heat generation component 31 by means of the locking members 23, whereby the bottom side 112 of the heat dissipation base seat 11 can tightly contact and attach to an upper surface of the heat generation component 31 (such as a central processing unit or a graphics processing unit). Alternatively, the heat dissipation base seat 11 can be locked and secured on a circuit board or a connection member (such as a backboard of a motherboard 32) positioned around the heat generation component 31 by means of the locking members 23. The circuit board securing base seat 33 is a securing base seat on the motherboard 32 inside an electronic device (such as a computer, a notebook or a server).

The press member 13 is disposed on the top side 111 of the heat dissipation base seat 11. The press member 13 is selected from a group consisting of a flat board body, a cross-shaped plate body, a U-shaped plate body, a frame body and a plate body with other geographic configuration. In this embodiment, the press member 13 is, but not limited to, a U-shaped plate body disposed on the top side 111 of the heat dissipation base seat 11 at the center of the top side 111 (or near the center of the top side 111). The press member 13 has at least one through hole 131 (there are two through holes 131 in the drawings), an upper side 132 and a lower side 133. The through holes 131 are formed at a center of the press member 13 and the protruding ends 1131 of the connection section 113 of the heat dissipation base seat 11 extend through the through holes 131. Accordingly, the lower side 133 of the press member 13 is in contact with the top side 111 of the heat dissipation base seat 11 so that the press member 13 applies uniform downward pressing force to forcedly make the bottom side 112 of the heat dissipation base seat 11 tightly attach to the heat generation component 31.

Moreover, multiple elastic members 22 (such as spring members) are disposed between the top side 111 of the heat dissipation base seat 11 and the lower side 133 of the press member 13. Two ends of each elastic member 22 respectively abut against the bottom section of each depression 115 of the top side 111 of the heat dissipation base seat 11 and the lower side 133 of the press member 13, whereby the pressing force of the press member 13 can be uniformly applied to the heat dissipation base seat 11.

The cover body 14 is made of such as plastic material or metal material. The cover body 14 has a receiving section 141 and two cover sections 142. The receiving section 141 is a channel positioned between the two cover sections 142. The receiving section is, but not limited to, recessed from the middle of the cover body 14 toward the press member 13, that is, the receiving section is designed with a recessed upper side and a raised lower side. Alternatively, the receiving section 141 of the cover body 14 can be designed with a recessed upper side and a plane lower side. The receiving section 141 has two opposite sidewalls 1411 and a bottom side 1412 connected between the two sidewalls 1411 in adjacency to the press member 13. The bottom side 1412 is formed with a window 1414. The protruding ends 1131 of the connection section 113 of the heat dissipation base seat 11 extend through the window 1414 into the receiving section 141 of the cover body 14. The two cover sections 142 respectively outward horizontally extend from one end of the two sidewalls 1411, which end is distal from the bottom side 1412. Each cover section 142 has a cover body lower side 146 facing the press member 13 and the heat dissipation base seat 11. Two cover body lateral sections 143 are respectively disposed under the two cover body lower sides 146 opposite to and in parallel to each other. The cover body lateral sections 143 protrude toward the heat dissipation base seat 11.

Figure 3A:
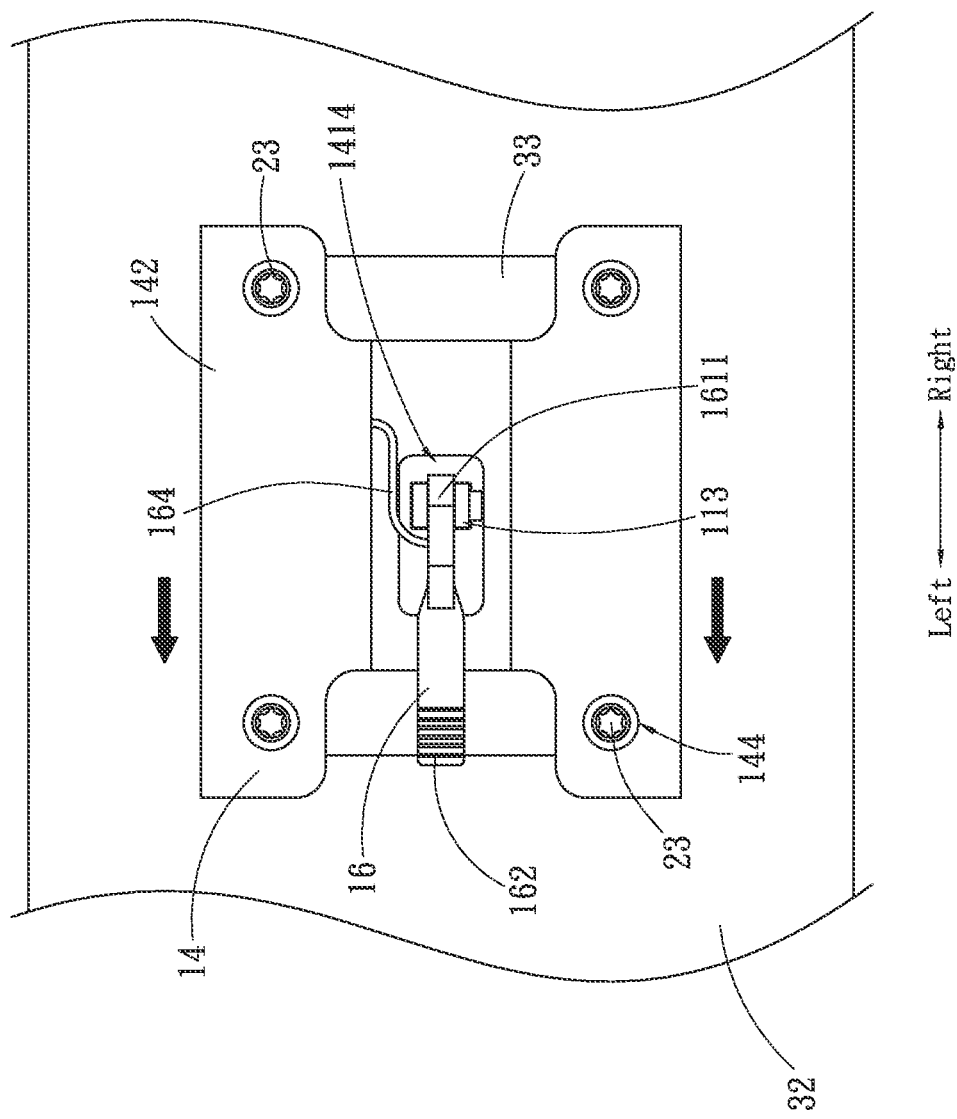
FIG. 3A is a top view of the present invention, showing that the operation member and the cover body of the present invention are moved from the second position to the first position.
Figure 3B:
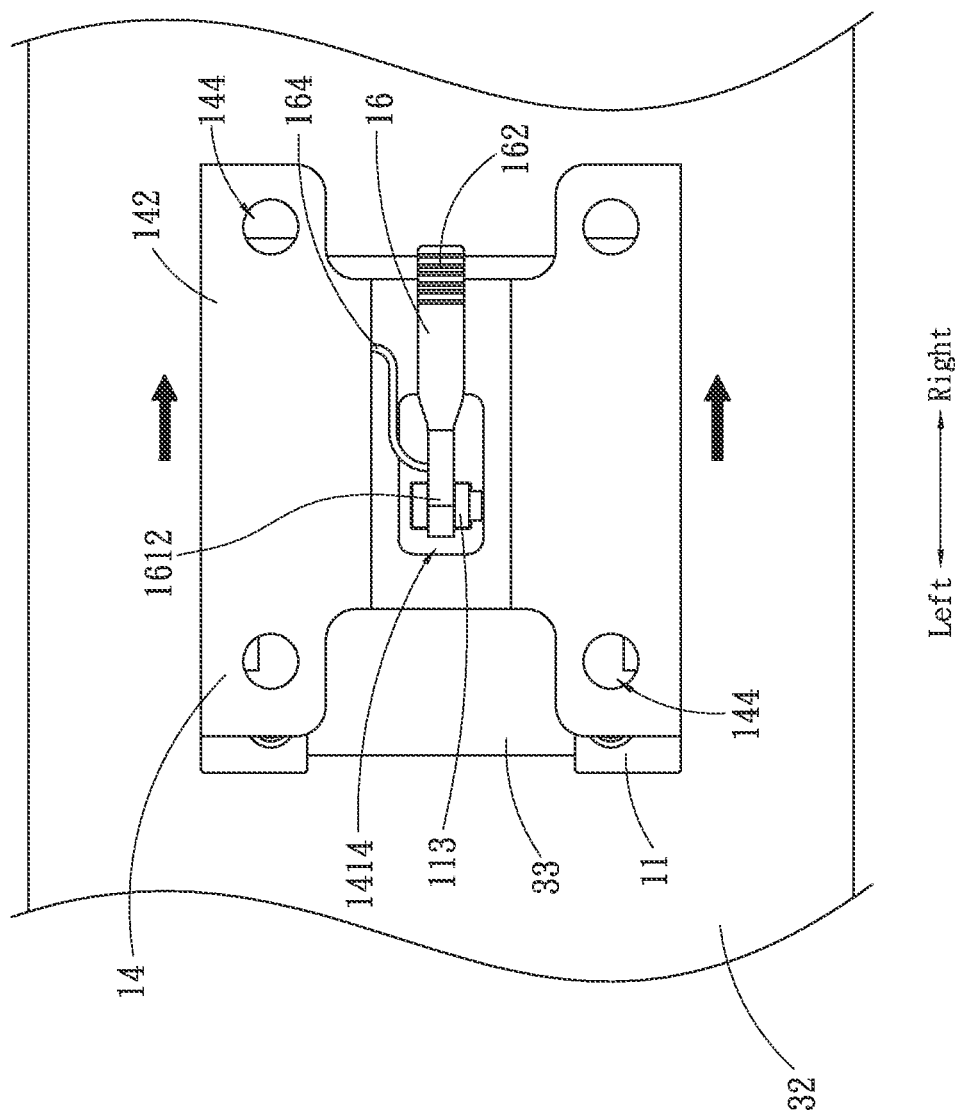
FIG. 3B is a top view of the present invention, showing that the operation member and the cover body of the present invention are moved from the first position to the second position.
Figure 4A:
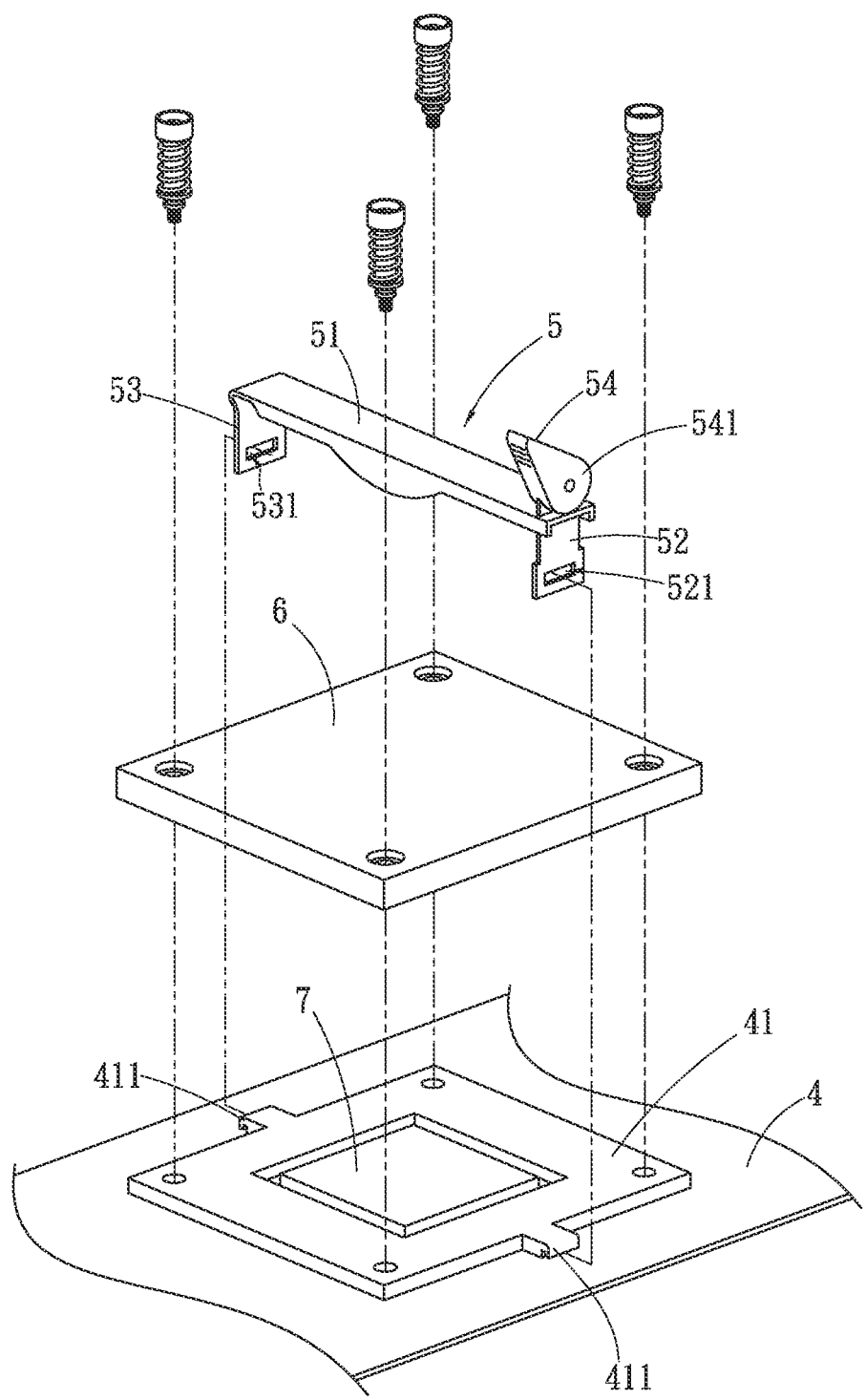
FIG. 4A is a perspective exploded view of a prior art.
Figure 4B:
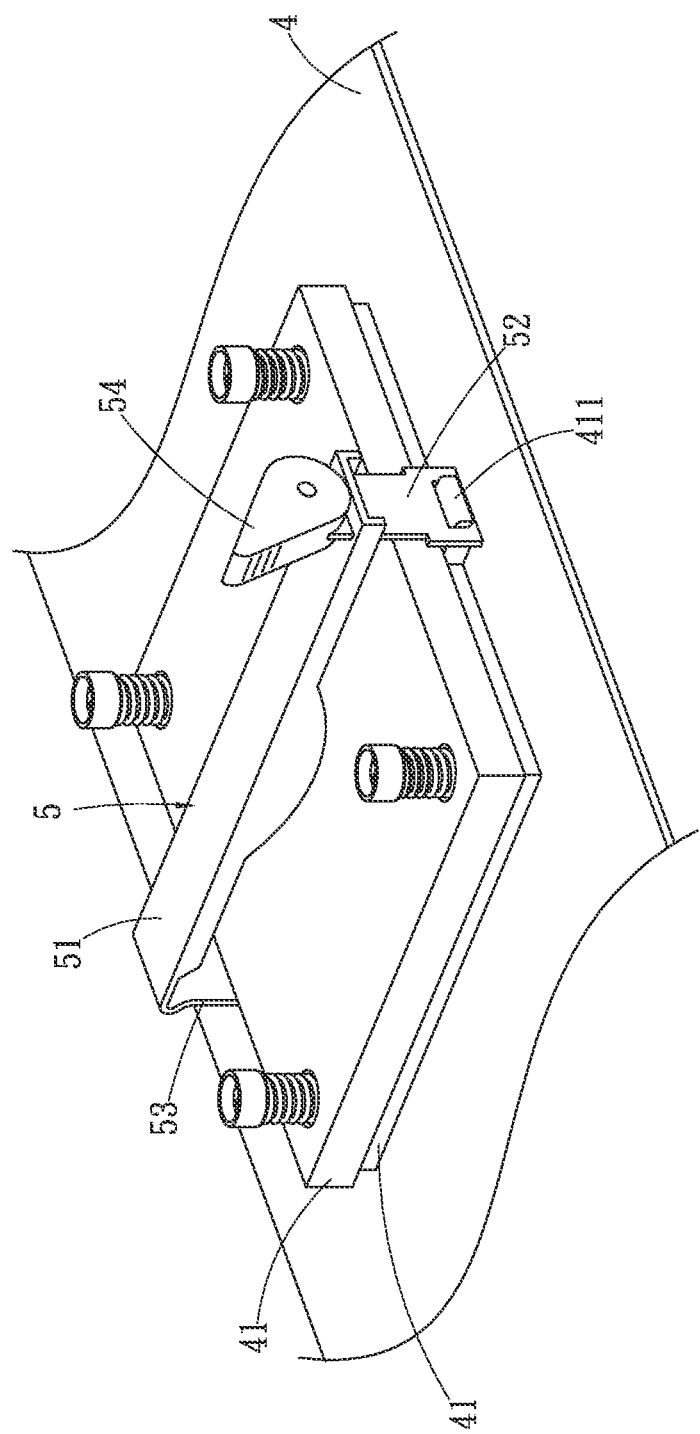
FIG. 4B is a perspective assembled view of the prior art.

To speak more specifically, the two cover body lateral sections 143 are positioned on outer sides of the protruding columns 116 of the heat dissipation base seat 11. Each cover body lateral section 143 is formed with multiple horizontal slots 1431. Each protruding column 116 has a protruding end formed with an insertion hole 117 corresponding to the horizontal slot 1431. A threaded locking member 21 is passed through each corresponding horizontal slot 1143 and insertion hole 117. One end of the threaded locking member 21 is locked with the insertion hole 117 to restrict the horizontal slot 1143 to horizontally slide relative to the threaded locking member 21. Accordingly, the cover body 14 can horizontally slide and move on the protruding columns 116 between a first position (as shown in FIG. 3A) and a second position (as shown in FIG. 3B).

In addition, the cover body 14 further has multiple perforations 144 and a cover body upper side 145. The perforations 144 are respectively formed on the two cover sections 142 of the cover body 14 corresponding to the perforations 114. The perforations 144 pass through the two cover sections 142 between the cover body upper side 145 and the cover body lower sides 146 of the two cover sections 142. When the cover body 14 is positioned in the first position (as shown in FIG. 3A), the perforations 144 are aligned with the locking members 23, whereby the locking members 23 are exposed to outer side through the perforations 144 and accessible. On the other hand, when the cover body 14 is moved from the first position to the second position (as shown in FIG. 3B), the perforations 144 are staggered from the locking members 23. In this case, the cover sections 142 shield the locking members 23, whereby the locking members 23 are not exposed to outer side through the perforations 144 and are inaccessible.

Please further refer to FIGS. 1 and 2B. The operation member 16 is received in the receiving section 141 and movably pivotally connected with the protruding ends 1131 of the connection section 113. The operation member 16 has an eccentric cam section 161 and an operation section 162 outward extending from the cam section 161. The cam section 161 is pivotally connected with the protruding ends 1131 of the connection section 113. The cam section 161 has a protruding side 1611 and a plane side 1612 opposite to the protruding side 1611. The protruding side 1611 is rotatable (such as clockwise rotated) with the rotation of the cam section 161 of the operation member 16 to the second position (such as a locking position), whereby the protruding side 1611 downward pushes and presses the upper side 132 of the press member 13. The plane side 1612 is rotatable (such as counterclockwise rotated) with the rotation of the cam section 161 of the operation member 16 to the first position (such as an unlocking position), whereby the plane side 1612 is in parallel to the upper side 132 of the press member 13 and the upper side 132 of the press member 13 is released from the pressing force of the cam section 161. When the operation member 16 is shifted to the first position, where the cam section 161 is such driven as not to press the upper side 132 of the press member 13, the press member 13 will not apply downward pressing force to the heat dissipation base seat 11. In this case, the heat dissipation base seat 11 is positioned in an unlocking position without attaching to the heat generation component 31 (as shown in FIG. 3A). On the other hand, when the operation member 16 is shifted to the second position, where the cam section 161 is such driven as to press the upper side 132 of the press member 13, the press member 13 applies downward pressing force to the heat dissipation base seat 11. In this case, the heat dissipation base seat 11 is located in a locking position and vertically forcedly tightly attached to the heat generation component 31 (as shown in FIG. 3B).

The operation section 162 is for a user's hand to hold and shift. When the operation section 162 of the operation member 16 is shifted to the first position (such as the unlocking position) or the second position (such as the locking position), the operation section 162 and the cam section 161 are received in the receiving section 141 of the cover body 14 so as to effectively prevent the user from shifting (touching) the operation member 16 and uninstalling the heat dissipation base seat 11 from the heat generation component 31 by error. In addition, a linking member 164 is further disposed between the operation member 16 and the cover body 14 and received in the receiving section 141. The linking member 164 is an elastic wire (such as a substantially Z-shaped or N-shaped elastic wire). The linking member 164 can be made of metal material or plastic material. One end of the linking member 164 is connected with the cam section 161 of the operation member 16, while the other end of the linking member 164 outward extends to connect with the sidewall 1411 of the receiving section 141. When the cam section 161 is driven by the operation section 162 to move between the first and second positions, the linking member 164 drives the cover body 14 to horizontally move to the first position or the second position.

Please now refer to FIGS. 3A and 3B and complementarily to FIG. 2B. For example, when the operation section 162 of the operation member 16 is shifted from the first position to the second position (in a direction as shown by the arrows of FIG. 3B, which indicate that the operation section 162 and the cover body 14 are horizontally moved from left side to right side), the cam section 161 of the operation member 16 is such as clockwise rotated on the protruding ends 1131 of the connection section 113 along with the shifting of the operation section 162. At the same time, one end of the linking member 164 is moved along with the rotation of the cam section 161 to drive the other end of the linking member 164 so as to drive the cover body 14 to move toward the second position. After the cover body 14 and the operation member 16 are moved to the second position (as shown in FIG. 2B), the operation member 16 is received in the receiving section 141 of the cover body 14 and the perforations 144 of the two cover sections 142 are staggered from the locking members 23. In this case, the two cover sections 142 shield the locking members 23 and the locking members 23 are not exposed to outer side through the perforations 144 (as shown in FIG. 3B). Accordingly, the entire structure cannot be uninstalled.

Reversely, when the operation section 162 of the operation member 16 is shifted from the second position to the first position (in a direction as shown by the arrows of FIG. 3A, which indicate that the operation section 162 and the cover body 14 are horizontally moved from the right side to the left side), the cam section 161 of the operation member 16 is such as counterclockwise rotated on the protruding ends 1131 of the connection section 113 along with the shifting of the operation section 162. At the same time, one end of the linking member 164 is moved along with the rotation of the cam section 161 to drive the other end of the linking member 164 so as to drive the cover body 14 to move toward the first position. After the cover body 14 and the operation member 16 are moved to the first position, the operation member 16 is received in the receiving section 141 of the cover body 14 and the perforations 144 of the two cover sections 142 are aligned with the locking members 23. In this case, the locking members 23 are exposed to outer side through the perforations 144 and accessible (as shown in FIG. 3A). Accordingly, a tool (such as a screwdriver) can be passed through the corresponding perforations 144 to drive (tighten or untighten) the locking members 23.

As aforesaid, the press member 13 is, but not limited to, disposed between the heat dissipation base seat 11 and the cover body 14. In a modified embodiment, the press member 13 is omitted. When operating the operation member 16, the cam section 161 is forced to directly press the top side 111 of the heat dissipation base seat 11 and make the heat dissipation base seat 11 vertically tightly attached to the heat generation component 31 and located thereon. At the same time, the linking member 164 is driven to drive the cover body 14 to horizontally move relative to the heat dissipation base seat 11 (from the first position to the second position). In this case, the cover body 14 shields the locking members 23 and prevents the heat dissipation base seat 11 from being uninstalled from the heat generation component 31 by error.

In still a modified embodiment, the heat dissipation base seat 11 is connected with a heat absorption end of at least one heat conduction member (such as a heat pipe). The heat absorption end of the heat conduction member is selectively passed through and connected in the heat dissipation base seat 11 and the heat dissipation base seat 11 is directly tightly attached to the heat generation component 31. Alternatively, the heat absorption end of the heat conduction member is embedded in at least one receiving recess formed on the bottom side 112 of the heat dissipation base seat 11. Accordingly, the heat absorption end of the heat conduction member on the bottom side 112 of the heat dissipation base seat 11 tightly attaches to the heat generation component 31. The heat generated by the heat generation component 31 is quickly transferred from the heat absorption end to a heat dissipation end of the heat conduction member at a remote end and then outward dissipated by a radiating fin assembly fitted on the heat dissipation end.

According to the design of the error-unlocking protection structure 1 for heat dissipation base seat of the present invention, when the operation member 16 is positioned in the locking position, the cover body 14 shields the locking members 23 to prevent the heat dissipation base seat 11 from being uninstalled from the heat generation component 31 by error. In addition, in both the locking position and the unlocking position, the operation member 16 is received in the receiving section 141 of the cover body 14 so that the user's hand is prevented from shifting the operation member 16 to the unlocking position within the limited space of the electronic device. Also, after the operation (such as installation or uninstallation) of other peripheral members is completed, when the user's hand is withdrawn from the limited space, the user's hand is prevented from touching or shifting the operation member 16 to the unlocking position by error.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. An error-unlocking protection structure for heat dissipation base seat, comprising:
    a heat dissipation base seat, the heat dissipation base seat having a top side, a bottom side and multiple perforations formed through four corners of the heat dissipation base seat, a locking member being passed through each perforation to secure the heat dissipation base seat on an upper side of a heat generation component and make the bottom side of the heat dissipation base seat in contact with the heat generation component, a connection section being disposed on the top side of the heat dissipation base seat to protrude therefrom, the connection section having a protruding end;
    an operation member having a cam section, the cam section being pivotally connected with the protruding end of the connection section; and
    a cover body disposed on the heat dissipation base seat, the cover body having multiple perforations respectively corresponding to the perforations of the heat dissipation base seat, a linking member being disposed between the cover body and the operation member, the linking member being respectively connected with the cover body and the cam section of the operation member, when operating the operation member, the cam section is forced to press the top side of the heat dissipation base seat and make the heat dissipation base seat vertically tightly attached to the heat generation component and located thereon, at the same time, the linking member being driven to drive the cover body to horizontally move relative to the heat dissipation base seat, whereby the cover body shields the locking members to prevent the heat dissipation base seat from being uninstalled from the heat generation component by error.

2. The error-unlocking protection structure for heat dissipation base seat as claimed in claim 1, further comprising a press member disposed between the top side of the heat dissipation base seat and the cover body, the press member having at least one through hole, the protruding end of the connection section extending through the through hole, the cover body having a receiving section recessed from the cover body toward the press member, the receiving section having a bottom side in adjacency to the press member, a window being formed on the bottom side, the protruding end of the connection section extending through the window into the receiving section.

3. The error-unlocking protection structure for heat dissipation base seat as claimed in claim 1, wherein the heat dissipation base seat is locked and secured on a circuit board securing base seat by means of the locking members.

4. The error-unlocking protection structure for heat dissipation base seat as claimed in claim 2, wherein multiple protruding columns are disposed on the top side of the heat dissipation base seat in adjacency to the perforations, an insertion hole being formed at one end of each protruding column, the cover body having two opposite cover body lateral sections protruding from the cover body toward the heat dissipation base seat, multiple horizontal slots being respectively formed on the cover body lateral sections corresponding to the insertion holes of the protruding columns, a threaded locking member being passed through each corresponding insertion hole and horizontal slot, whereby the horizontal slots are restricted to horizontally slide relative to the threaded locking member.

5. The error-unlocking protection structure for heat dissipation base seat as claimed in claim 2, wherein the press member is U-shaped.

6. The error-unlocking protection structure for heat dissipation base seat as claimed in claim 1, wherein the cover body is made of plastic material.

7. The error-unlocking protection structure for heat dissipation base seat as claimed in claim 1, wherein the linking member is an elastic wire made of metal material.

8. The error-unlocking protection structure for heat dissipation base seat as claimed in claim 2, wherein the receiving section is a channel.

9. The error-unlocking protection structure for heat dissipation base seat as claimed in claim 2, wherein the operation member has an operation section outward extending from one end of the cam section, whereby the operation section can be shifted to drive the cam section to press or not to press the press member.

* * * * *